United States Patent
Liu (10) Patent No.: US 8,643,398 B1
(45) Date of Patent: Feb. 4, 2014

(54) PLACING INTEGRATED CIRCUITS INTO LOW VOLTAGE MODE FOR STANDBY PURPOSES

(71) Applicant: Lattice Semiconductor Corporation, Hillsboro, OR (US)

(72) Inventor: Mitch Liu, Mountain View, CA (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 0 days.

(21) Appl. No.: 13/680,947

(22) Filed: Nov. 19, 2012

Related U.S. Application Data (63) Continuation of application No. 13/193,984, filed on Jul. 29, 2011, now Pat. No. 8,314,632.

(51) Int. Cl.
*H03K 17/16* (2006.01)
*H03K 19/003* (2006.01)

(52) U.S. Cl.
USPC ............................................. 326/21; 713/323

(58) Field of Classification Search
None
See application file for complete search history.

(56) References Cited

U.S. PATENT DOCUMENTS

| 5,920,727 | A | * | 7/1999 | Kikinis et al. | 713/323 |
| 5,987,613 | A | * | 11/1999 | Busch et al. | 713/300 |
| 7,802,116 | B2 | * | 9/2010 | Ravichandran | 713/320 |
| 2007/0014178 | A1 | * | 1/2007 | Fujioka et al. | 365/227 |

\* cited by examiner

*Primary Examiner* — Crystal L Hammond (57) ABSTRACT

In one embodiment, a core logic section of an integrated circuit is switched to be powered by a standby mode power voltage lower than a normal mode power voltage when the circuit is switched into a standby mode. The standby mode power voltage, however, is too low relative to normal ground to drive a transition logic section of the circuit. A special ground bus is provided in the transition logic section. The special ground bus is pulled down to a voltage below normal ground (i.e., a negative voltage) when the circuit is switched to the standby mode.

13 Claims, 6 Drawing Sheets

PLACING INTEGRATED CIRCUITS INTO LOW VOLTAGE MODE FOR STANDBY PURPOSES

RELATED APPLICATION DATA

This application is a continuation of U.S. application Ser. No. 13/193,984, filed Jul. 29, 2011, now U.S. Pat. No. 8,314,632, which is incorporated herein by reference in its entirety.

TECHNICAL FIELD

The present disclosure of invention relates generally to digital integrated circuit systems that can be placed in low power standby mode. The disclosure relates more specifically to digital integrated circuits that have core logic, input-output interface banks and a transition layer between the core logic and the I/O interface banks.

DESCRIPTION OF RELATED TECHNOLOGY

Modern integrated circuit devices may be characterized as being formed with a monolithic integrated circuit (IC) that typically has three major sections of circuitry, namely, a core logic section, an input/output (I/O) section that typically is disposed surrounding the core logic section and a transition section (e.g., signal levels shifting or translation layer) that typically is interposed between the core logic section and the I/O section.

The core logic section can be fabricated to consist essentially of relatively small transistors that can operate at relatively low voltages (e.g., <3.3V and more typically at about 1.2V) and at relatively high frequencies (e.g., about 50 MHz to about 2 GHz when at sufficient voltage and small enough channel size). However, the I/O section generally needs to operate at higher voltage levels and thus needs substantially larger transistors that are capable of safely and reliably operating under larger power conditions (e.g., greater operating voltage levels and greater currents).

As one way of reducing power consumption, it has been proposed; particularly for synchronous CMOS circuits (complementary metal oxide semiconductor circuits or the like), to reduce the clocking frequency of such synchronous circuits when they are commanded to enter a temporary standby mode. For example, the standby mode reduced clocking frequency may be about 10% of the normal operating rate (e.g., 5 MHz in place of 50 MHz). Such a standby mode will be understood to mean herein that the IC remains operatively available during its low power sleep or standby mode to be triggered by one or a few specifically predefined external events into quickly returning to a full power/full speed operational mode as is indicated to be needed by the predefined external events. However, other than that, the remaining resources of the asleep (in standby mode) are not then available for full-power/full-speed operational use.

Given that quick response to at least the one or few specifically predefined external events (and in typical cases, to all possible such external events) is required while in standby mode, the corresponding I/O circuits of the IC may need to be always deterministically operational (even if at the slower standby speeds) so that they can be adequately responsive to external events that call for re-awakening of the on-standby IC out of its sleep mode. More specifically, the certain corresponding I/O circuits may be ones that interface with corresponding exterior nodes onto which there are applied corresponding signals representing the predefined, re-awakening external events.

As a consequence of the above, certain corresponding core logic circuits that interface with sleep-ending I/O circuits may also need to remain operational during the standby mode, even if at lower clocking frequencies so as to properly respond to the predefined external triggering events that warrant partial or full reawakening of the one IC and/or of other associated IC's.

While the above-mentioned technique of reducing clock frequency can provide a first level of reduction in power consumption, even more power reduction could advantageously be obtained if operating supply voltages of the in-standby-mode IC's could be reduced. More specifically, power draw by resistive components of the IC can be approximated on a rough first order level as $V^2/R$ and thus reducing the supply voltage by 50% may reduce corresponding power draw down to about 25% of original due to that voltage-based factor alone. (Clock rate reduction also works to reduce power draw.) However, when supply voltage reduction is attempted, a problem emerges. The transition layer (e.g., signal levels shifting layer) of the IC that is interposed between the core logic section and the I/O section generally needs a relatively high power supply voltage to remain operational. It therefore appears to be an insurmountable obstacle to achieving voltage-reduction based decrease in the power consumption of low-power standby-capable IC's.

It is to be understood that this background of the technology section is intended to provide useful background for understanding the here disclosed technology and as such, the technology background section may include ideas, concepts or recognitions that are not part of what was known or appreciated by those skilled in the pertinent art prior to corresponding invention dates of subject matter disclosed herein.

BRIEF DESCRIPTION OF THE DRAWINGS

The below detailed description section makes reference to the accompanying drawings, in which.

DETAILED DESCRIPTION

Figure 1:
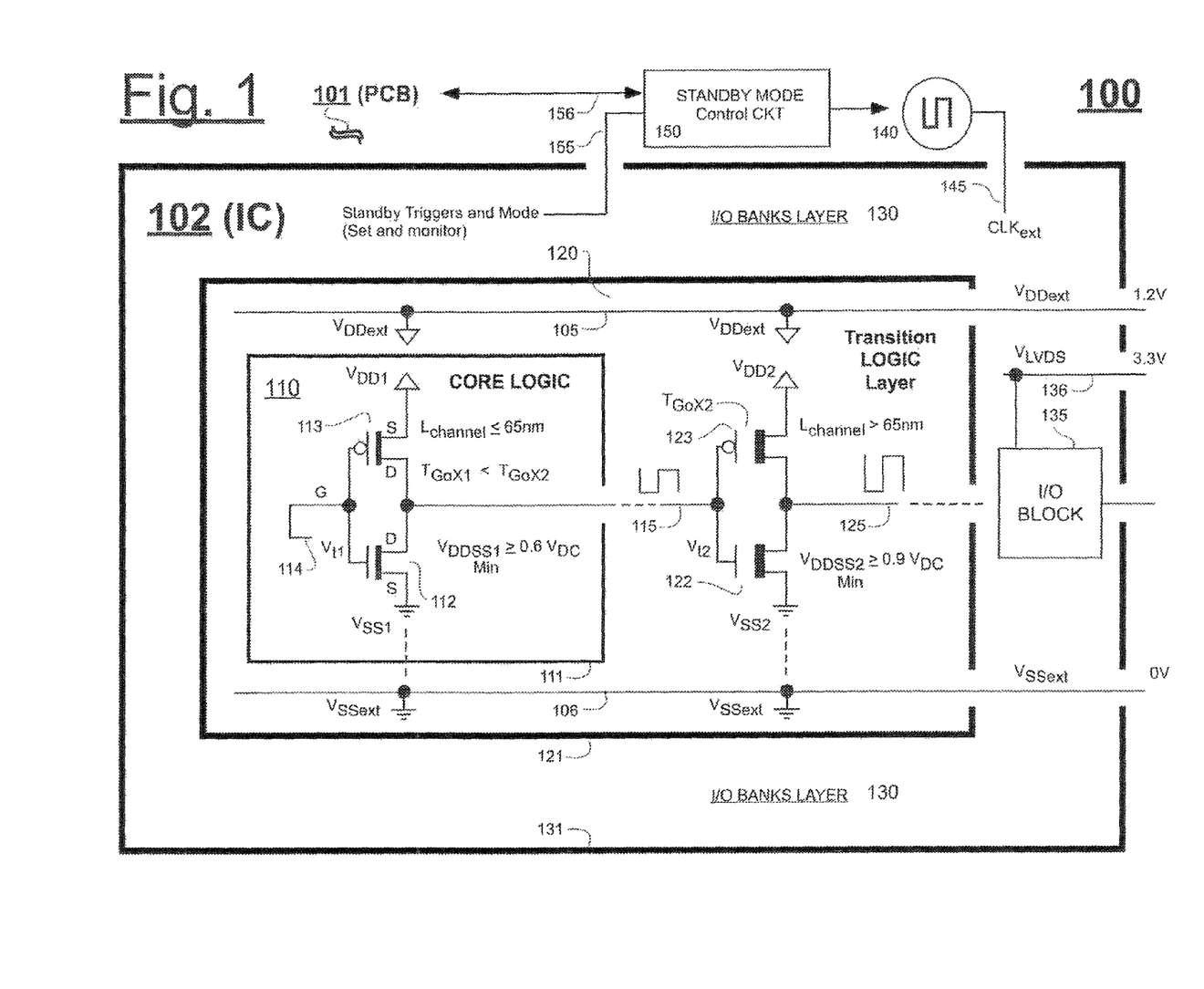
FIG. 1 is a block diagram of a first synchronous digital system that includes one or more monolithic integrated circuits (IC's) that are switchable into a low power consumption standby mode by reducing frequency of an IC driving clock signal, where each IC includes a core logic section, an I/O section and a transition logic section interposed between the core and the I/O sections.

Referring to FIG. 1, shown here is a block diagram of a first synchronous digital system 100 to which the here disclosed teachings may be applied.

The illustrated first system 100 may include one or more printed circuit boards 101 (PCBs, only one such PCB is schematically denoted by the double tilde (≈) symbol) on which there may be mounted one or an interconnected plurality of monolithic integrated circuits (IC's). In the illustrated example, the on-board CMOS IC 102 is one such silicon-based monolithic integrated circuit and the on or off-board standby mode control circuit 150 can be another such monolithic integrated circuit. (Alternatively some or most of the functionality of standby mode control circuit 150 can be integrated into the internal circuitry of exemplary IC 102 as will be seen the embodiment of FIG. 2B is described.)

Although not explicitly shown in FIG. 1, it is to be understood that PCB 101 may be multi-layered and may be part of a mobile device such as a battery-powered cell phone, or smartphone, or palmtop or laptop or tablet computer for which an ultra-low power standby mode is often desirable so as to increase mobile operating time between re-chargings of the battery (not shown). Battery preservation is just one example. There may be more or other reasons for repeatedly causing one or more of the IC's of the first synchronous digital system 100 to individually or collectively enter into and exit from respective or collective low power standby modes. By way of example, temperature control can be another reason for switching selected parts or substantially all of the system 100 into low power standby mode (LPSM).

The standby mode control circuit 150 (hereafter also "SM control circuit 150") may be tasked with the responsibility of determining if and when standby mode (SM) should be entered into by a selected part or substantially all of the circuitry of system 100 and of determining if and how standby mode (SM) should be exited from by part or substantially all of the circuitry of system 100.

More specifically, input signals acquired by the SM control circuit 150 through one or both of the illustrated control lines, 155 and 156 may indicate that standby is warranted because, for example, a user of the system 100 has not interacted with the system for more than a predetermined duration of time (e.g., in the last 10 minutes) or because the user has requested standby mode. In such a case, the SM control circuit 150 may responsively signal various in-system IC's such as 102 (via control line 155) to prepare for entry into low power standby mode. Thereafter the SM control circuit 150 may cause a controlled clock signal generator 140 to switch from a predetermined normal operating frequency (e.g., 50 MHz-2 GHz) to a substantially lower than normal frequency (e.g., 5 MHz-200 MHz). By way of a more specific example, the clock signal generator 140 may be commanded by SM control circuit 150 to switch from a normal operating frequency in the many millions of cycles per second (e.g., $f_{NORM}$=50 MHz) to a low power standby mode frequency that is one or several orders of magnitude smaller (e.g., $f_{LPSM}$=5 MHz or $f_{LPSM}$=10 KHz). As a result of the switch to the substantially lower standby frequency (e.g., 5 MHz), various clocked circuits (e.g., 110) within IC 102 will draw less power and as a result, battery life can be extended and/or circuit temperature can be kept below a predefined maximum level. (Although not shown, in one embodiment, SM control circuit 150 includes or is coupled to temperature sensor(s) that sense(s) temperature(s) at predetermined circuit locations.) Although not explicitly shown, it is also to be understood that control line 156 may be operatively coupled to other IC's that are similar to the illustrated IC 102 and that control line 156 may be operated in a fashion substantially similar to the way that line 155 is operated. The SM control circuit 150 may have many more control lines like 155 and 156 and may thereby coordinate with regard to which IC's are to be switched into low power standby mode (LPSM) or out of it and when. The SM control circuit 150 may be supervised by a digital microcomputer (not shown), or a control memory, or the like that has appropriate programming provided therein for determining which IC's are to be switched into low power standby mode (LPSM) or out of it and when and in response to what external conditions.

For purpose of explanation, the exemplary IC 102 is shown to contain complementary metal oxide semiconductor (CMOS) circuitry. More specifically, a core logic section 110 of the IC 102 is shown to comprise insulated gate field effect devices (IGFET's) such as silicon NMOS transistor 112 and silicon PMOS transistor 113 interconnected in complementary circuit configuration so that, with the exception of state switching time, one of the NMOS and PMOS transistors is bistably held in a low resistance state (low $R_{DS}$ as between source and drain terminals) and the other is bistably held in a comparatively much higher resistance state (high $R_{DS}$ as between S and D terminals). The complementary, low $R_{DS}$ (ON) and high $R_{DS}$ (OFF) states can be bistably swapped as between the complementary transistors 112/113 by switching a shared gate voltage ($V_G$, on gate line 114) between appropriate transistor turning on and turning off voltage ranges. (While not shown, in one embodiment the gate line 114 emanates from a clock-controlled preceding circuit that allows the gate voltage, $V_G$ to change only at rising edges and/or falling edges of a supplied clock signal (e.g., derived from line 145). The respective transistor turning-on gate voltages range ($V_{Gon}$) and turning off ($V_{Goff}$) gate voltages range may be respectively selected to be spaced above and below a predetermined threshold voltage ($V_t$) of the respective transistors while providing a predetermined noise tolerance margin. Threshold may be a function of various factors including, but not limited to, the type of semiconductor used (e.g., silicon, SiGe, III-IV compounds, etc.), dopants and concentrations thereof that are used, and temperature. For example, if the threshold voltage ($V_t$) of the NMOS device is 0.6V and the desired noise tolerance margin is ±0.2V then $V_{Goff}$ for the NMOS device 112 will be set to about 0.4V or lower and $V_{Gon}$ will be set to about 0.8V or higher. Conversely, for the complementary PMOS device 113 and for the same $V_t$, the $V_{Goff}$ range will be set to 0.8V or higher and the $V_{Gon}$ range will be set to 0.4V or lower.

It can be appreciated from the above that a voltage difference between the IC-internal power rail 105 and the IC-internal ground rail 106 of about 1.2V or higher can accommodate for such design requirements. More specifically, under idealized theoretical conditions where the $R_{DS}$ (ON) of the turned on transistor is taken to be very close to zero ohms, a logic "0" may be signaled on output line 115 by providing an output voltage of 0V (equal to the NMOS source voltage, $V_{SS1}$) and a logic "1" may be signaled on output line 115 by providing an output voltage of +1.2V (equal to the PMOS source voltage, $V_{DD1}$). Accordingly, under this design paradigm, the chip internal, first power rail 105 needs to deliver a $V_{DD}$ supply voltage of +1.2V to the $V_{DD1}$ nodes (only one shown) of the core logic section 110 from an external or internal power supply source (not shown). Also under this design paradigm, the second chip-internal power rail 106 (hereinafter also known as the "normal" ground or GND rail 106) needs to be delivering a $V_{SSext}$ supply voltage of 0V (ground) to the $V_{SS1}$ nodes (only one shown) of the core logic section 110.

As those skilled in the CMOS circuitry arts will appreciate, CMOS circuits operate primarily as capacitive loads, but they can have measurable leakage current because, for example, $R_{DSoff}$ is not infinite. Thus the power consumed by CMOS circuits when in normal operational mode (e.g., >50 MHz) is determined predominantly by how often the capacitive loads are charged and discharged and to what depth (e.g., in terms of voltage change) they are so charged or discharged. Accordingly, one way of substantially reducing power consumption by the IC 102 is by drastically reducing the frequency of the clocking signal ($CLK_{ext}$) 145 that drives the core logic 110. As a result, the number of capacitance charges and discharges per second is reduced and power consumption by the IC 102 can be thereby substantially reduced while battery longevity can be prolonged.

Moreover, and under the same basic theory, if the ON and OFF operating voltages of the core logic section 110 could also be reduced, that too would help lower power consumption during standby mode (SM) because the depth of each charge and discharge of the core logic capacitive loads will be reduced (because P=V*I=V*dQ/dt=V*C*dV/dt). However, practical considerations appear to bar a design change that takes core logic supply voltage ($V_{DD1}$) below its normal operating range (e.g., below 1.2V).

The problem arises primarily due to the presence of external circuitry disposed outside an outer operational shell (e.g., packaging) 131 of the IC 102. The external circuitry (not shown) generally calls for signaling levels that are higher than those used inside the chip. For example, the external signaling level may be a TTL one that operates between ground and a 5.0V power rail or the external signaling level may be a LVDS one that operates between ground and a 3.3V power rail. In FIG. 1, the example IC 102 is shown to have three operational shell boundaries, namely, 111, 121 and 131, where the core logic 110 is disposed inside boundary 111, a transition logic section 120 is disposed inside boundary 121, and an I/O interface section 130 is disposed inside boundary 131. External circuitry (not shown) is understood to be disposed outside of boundary 131 and to be operatively coupled to the exemplary IC 102.

Since the external circuitry (which external circuitry outside of chip shell 131 is not explicitly shown except for the possible presence thereat of units 140 and 150) is generally required to operate according to an industry standardized signaling level, for example, according to a so-called LVDS digital signaling standard which calls for switching between a nominal +3.3V level (representing logic "1") and a 0V or ground level (representing logic "0"), level shifting has to be performed as between the external signaling levels and chip internal signaling levels. More specifically, because the LVDS-based external circuitry (not shown) is not designed to receive a midway voltage signal of say +1.5V as an input because then the LVDS-based external circuitry cannot tell if such a hypothetical +1.5V input signal represents a "1" or a "0" and moreover, because such a hypothetical +1.5V input signal may drive the LVDS-based external circuitry into an undesirable crowbar shorting mode, the I/O interface section 130 has input and output signals operating according to the external signaling levels (e.g., LVDS).

By way of a second example, the external circuitry may utilize a so-called TTL standard where the latter calls for switching between a nominal +5.0V level and normal ground (0V). Such yet higher voltage, external signaling levels (e.g., +5V/0V) are typically not directly compatible with the internal and lower signaling levels (e.g., +1.2V and ground) that are usually used within the core logic section 110 of the exemplary IC 102. As such, a transition or signaling levels translation logic section 120 generally needs to be interposed between the core logic section 110 and the I/O interface section 130 of the IC 102.

As mentioned above, in the schematic illustration of FIG. 1, the first shell boundary line 111 (a hypothetical boundary line) denotes the outskirts of core section 110. The second shell boundary line 121 similarly denotes the outskirts of transition logic section 120 and the third shell boundary line 131 denotes the outskirts of I/O interface section 130. The latter I/O layer or section 130 includes I/O blocks such as the illustrated 135 for directly interfacing with the chip external circuitry (not all shown). In one embodiment, the I/O layer 130 has plural "banks" of I/O blocks; for example a first bank (not shown) is provided for interfacing with external LVDS circuitry, a second bank (not shown) is provided for interfacing with external TTL circuitry, a third bank (not shown) is provided for interfacing with yet another external set of signaling levels, and so on. A programmable control memory (not shown, could be nonvolatile memory) within the IC 102 determines which bank or banks is/are to be the active bank(s) and which are to be not used (e.g., have their outputs driven to the high impedance or Hi-Z state).

The transition logic section 120 typically comprises a plurality of level shifting circuits (not fully shown) that transform core logic signaling levels (e.g., digitally switching between +1.2V and GND) to other signaling levels appropriate for the I/O block units 135 (e.g., digitally switching between +3.3V and GND if for LVDS operation). A schematically drawn, first coupling line 115 is provided between an output of the core logic section 110 and an input of the transition logic layer 120 and this line 115 is understood to be operating with the normal core logic signaling levels (e.g., +1.2V and GND) of the core interior. On the other hand, a schematically drawn second coupling line 125 is shown provided between an output of the transition logic layer 120 and an input of I/O block 135 and this second line 125 is understood to be operating with the different logic signaling levels (e.g., +3.3V/GND) of the associated I/O block 135. A within-core input line 114 of circuit 112/113 is understood to also be operating with the core logic signaling levels (e.g., +1.2V/GND) of the core interior. For sake of illustration, core input line 114 may be understood to be receiving a clocked signal from a core-driving output node (not shown) of the transition logic layer 120.

In order for the transition logic layer 120 to be able to withstand the larger voltage swings that are presented to it by the I/O layer 130 of the IC and the larger currents handled thereby, the transition logic layer 120 and more specifically, certain interfacing transistors (e.g., 122) of the transition logic layer 120 are typically designed and structured to have thicker gate insulating layers (e.g., Gate OXide layers or GoX) and greater channel lengths ($L_{channel}$) than those of the core logic transistors (e.g., 112). The larger GoX thickness ($T_{GoX2} > T_{GoX1}$) and larger channel lengths ($L_{channel2} > L_{channel1}$) typically result in higher minimum threshold voltages ($V_{tmin2} > V_{tmin1}$, where here, the "2" in the subscript corresponds to layer 120 and the "1" in the subscript corresponds to core section 110). As such, the minimum rail to opposed power rail voltage drop, $V_{DDSS2}$ of the transition logic layer 120 generally has to be larger than the operative minimum rail to opposed power rail voltage drop, $V_{DDSS1}$ of the core logic section 110 in order for the transition logic layer 120 to be operational in a deterministic way. By 'deterministic', it is meant here that expected binary logic operations are assured to an acceptable level of consistency even in the presence of expected amounts of signal noise. If the power rail-to-power rail voltage, $V_{DDSS2}$ of the transition logic layer 120 is made too small, the transition logic layer 120 may fail to operate in a desired deterministic way. Incidentally, as will be understood by those skilled in the semiconductor fabrication art, many factors other than just gate oxide thickness ($T_{GoX}$) and/or transistor channel length ($L_{channel}$) may contribute to definition of each transistor's ultimate threshold voltage ($V_t$) and gate insulation breakdown voltage ($V_{gsBREAK}$). The other contributing factors may include channel doping concentrations and profiles as well as dielectric constants and breakdown characteristics of the material(s) used for the gate insulating film (GoX), and so forth.

Aside from the need to have certain minimum rail to opposed power rail voltage drops (e.g., $V_{DDSS1MIN}$, $V_{DDSS2MIN}$) for the sake of operating with a desired degree of determinism and noise tolerance relative to the threshold voltages ($V_t$) of the switching elements (e.g., 112, 122) used in the respective logic sections (110, 120, etc.), for many technologies where charge carrier drift velocity is determined by the applied voltage drop, the maximum switching speed of the switching elements (or more correctly, the minimum signal propagation delays thereof) is limited by the available rail to opposed power rail voltage drop (e.g., $V_{DDSS1MIN}$, $V_{DDSS2MIN}$) and therefore, when the supplied rail-to-rail potential is decreased, the maximum allowed clocking rate should be commensurately decreased so the less powered circuits can keep up with the switching rates of the switched signals applied to them.

With the above as background, the bird's eye overview is that design and fabrication of at least some transistors (e.g., 122) within the transition logic layer 120 will produce a design need for the transition logic layer 120 to require a larger, acceptable-as-minimum, power rail-to-rail voltage drop, $V_{DDSS2MIN}$ than that ($V_{DDSS1MIN}$) which is acceptable-as-minimum for deterministic operation at a given clocking rate (e.g., 5 MHz) for the core logic section 110.

For one class of embodiments, it has been determined that the minimum inter-power rail voltage drop, $V_{DDSS2}$ of the transition logic layer 120 is about 0.9V. In other words, the voltage drop between the $V_{DD2}$ node and the $V_{SS2}$ node in the transition logic layer 120 of each core-interfacing CMOS circuit (e.g., the one shown to be receiving a signal on line 115 from the core 110) has to be at least about +0.9V even when operating at relatively low clock frequency (e.g., 5 MHz or less) and under relatively low noise conditions.

On the other hand, for the same class of embodiments, it has been determined that the minimum power rail-to-power rail voltage drop, $V_{DDSS1MIN}$ inside the core logic section 110 can be made as low as about 0.6V when operating at relatively low clock frequency (e.g., 50 MHz or less) and under relatively low noise conditions. More specifically, when channel lengths ($L_{channel\_1}$) in the core logic section 110 are designed to be about 65 nanometers or less (e.g., about 45 nm), the threshold voltage can be reduced to as low as about 0.3V and deterministic binary operation is still then possible even with the $V_{DDSS1}$ rail-to-rail difference inside the core logic section 110 is made as low as about 0.6V. However, the minimum inter-power rail voltage drop, $V_{DDSS2MIN}$ of the transition logic layer 120 is +0.9V and this appears to prevent the operating of the core logic section 110 at the yet lower $V_{DDSS1MIN}$ value of about 0.6V.

Before explaining how this disparity problem between $V_{DDSS1min}$ versus $V_{DDSS2min}$ may be overcome, first a brief explanation is provided as to why deterministic operability of both the core logic section 110 and the transition logic layer 120 may be needed to begin with during a low power standby mode (LPSM). After all, if the exemplary IC 102 is asleep, why care what happens inside IC 102 during that sleep period? One answer is that functioning of the SM control circuit 150 may vary and the location of the SM control circuit 150 (see briefly FIG. 2B) can also vary, whereby in various situations, deterministic switching operations within the core logic section 110 is necessary. More to the point, the level of intelligent functioning needed of the SM control circuit 150 can be very simple, or extremely complex, or anywhere in the midst of that spectrum of possibilities and the assistance of the core logic section 110 may be necessary for enabling the SM control circuit 150 to perform its functions.

One example of very simple control of low power standby mode might be a circuit (not shown) that detects failure of a user to press a keyboard key in the last 5 minutes, whereupon a corresponding keyboard watchdog circuit (not shown) commands the SM control circuit 150 to instantiate switching of the entire system 100, (except for the keyboard watchdog circuit and circuits 150, 140) into a full low power standby mode (100% LPSM). Later, when the user presses a keyboard key, the keyboard watchdog circuit automatically commands the SM control circuit 150 to instantiate a switching of the entire system 100 out of the LPSM mode and back to full-powered normal operating mode (e.g., clock generator 140 switches from applying a relatively slow 5 MHz clock to all subcircuits back to applying a substantially faster 50 MHz clock signal to them). Even in such a simple case, the core logic section 110; when it is awakened, has to come up in a deterministic way and the transition logic layer 120 also has to awaken and come up in a deterministic state. Accordingly it is not advisable to let either of sections 110 and 120 enter a nondeterministic state during standby mode.

In a more complex example where system 100 is put-to-sleep and then re-awakened, the switching of various subcircuits of system 100 into and out of low power standby mode (LPSM) may be more nuanced in that different permutations of such subcircuits are put to sleep and later re-awakened as external conditions change. In one exemplary embodiment, the core logic section 110 of IC 102 includes programmable logic circuitry (not explicitly shown) such as programmable lookup tables (LUTs) and programmable interconnect of the type found in Field Programmable Logic Arrays (FPGA's) or in other Programmable Logic Devices (PLD's). During system boot-up, the programmable logic circuitry (not explicitly shown) of core logic section 110 is automatically configured to respond to low power standby mode (LPSM) being asserted for IC 102 by periodically monitoring certain I/O nodes of that IC 102 and repeatedly testing for the appearance of predetermined states or patterns of signals on those nodes (e.g., has a keyboard key been depressed and if so, which one?). Because IC 102 is often in its LPSM at that boot-up time, the monitoring will occur at a relatively slow rate (e.g., clocked at 5 MHz rather than 50 MHz). Nonetheless, it is desirable that such watchdog monitoring be performed deterministically by the in-LPSM IC 102 and that when a given awaken triggering event is detected by IC 102 alone or by IC 102 in conjunction with external other circuits, that IC 102 will be able to output its event detection signal(s) by way of control line 155 to the SM control circuit 150, whereafter circuit 150 responsively determines when and which parts or all of the currently asleep (in standby mode) subcircuits of system 100 are to be then awakened.

While not explicitly shown in FIG. 1, it is to be understood that control line 155 (extending out of block 150) may operatively couple to core logic section 110 first by way of the I/O banks layer 130 and then by way of the transition logic layer 120 of IC 102. Control line 155 may be a bidirectional serial line or bus that communicates with the core logic section 110. As such, deterministic operability of both the core logic section 110 and the transition logic layer 120 is needed during a low power standby mode (LPSM) of IC 102 so that deterministic and correct signal exchanges may occur over control line 155 and as between the core logic section 110 and the SM control circuit 150 (if it is external—but see FIG. 2B where 250' thereof is internal).

Figure 2A:
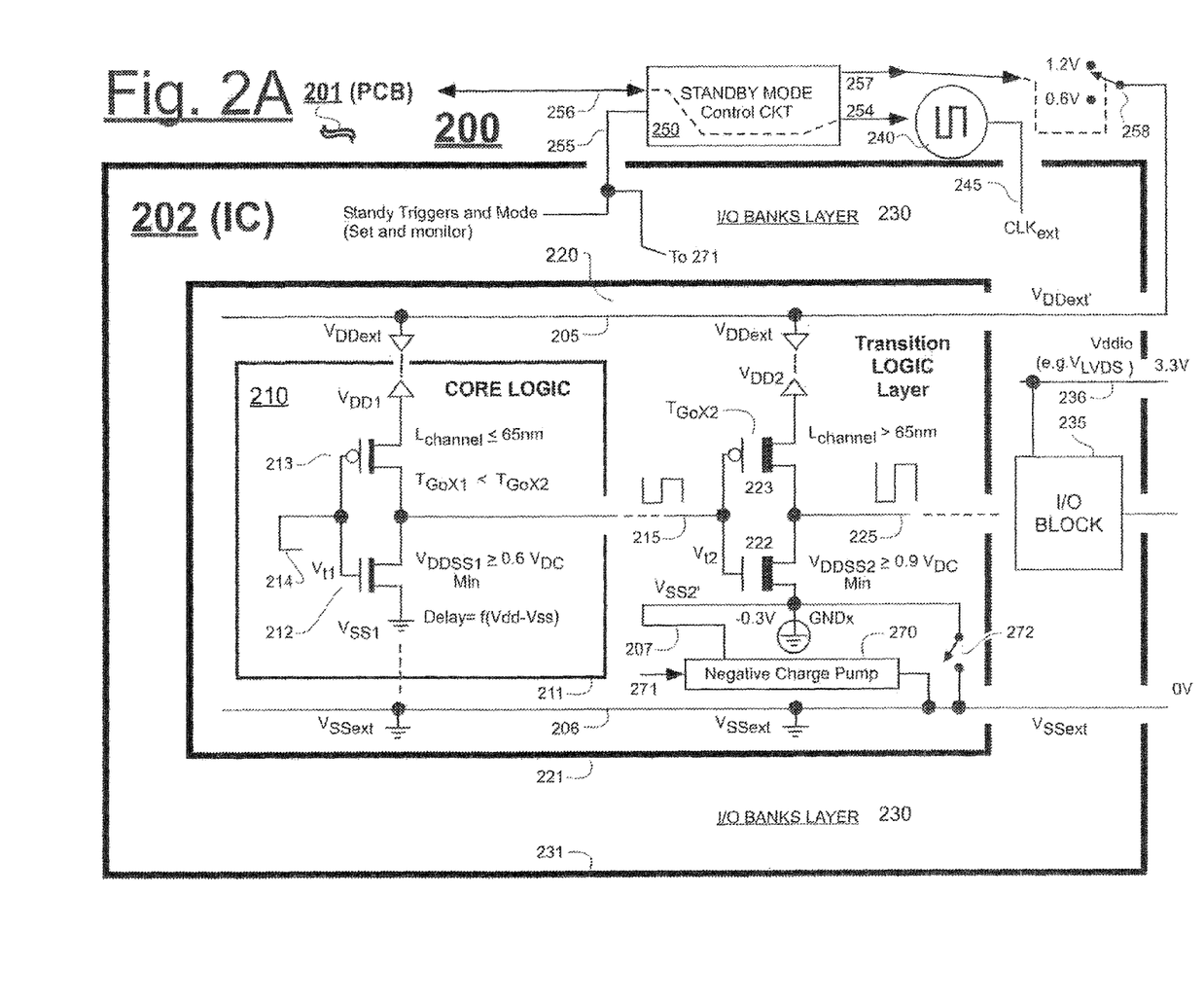
FIG. 2A is a block diagram of a second synchronous digital system that includes one or more monolithic integrated circuits (IC's) that are switchable into a low power consumption standby mode by at least reducing the applied power supply voltage for the core logic section if not also substantially reducing the frequency of an IC driving clock signal.
Figure 2B:
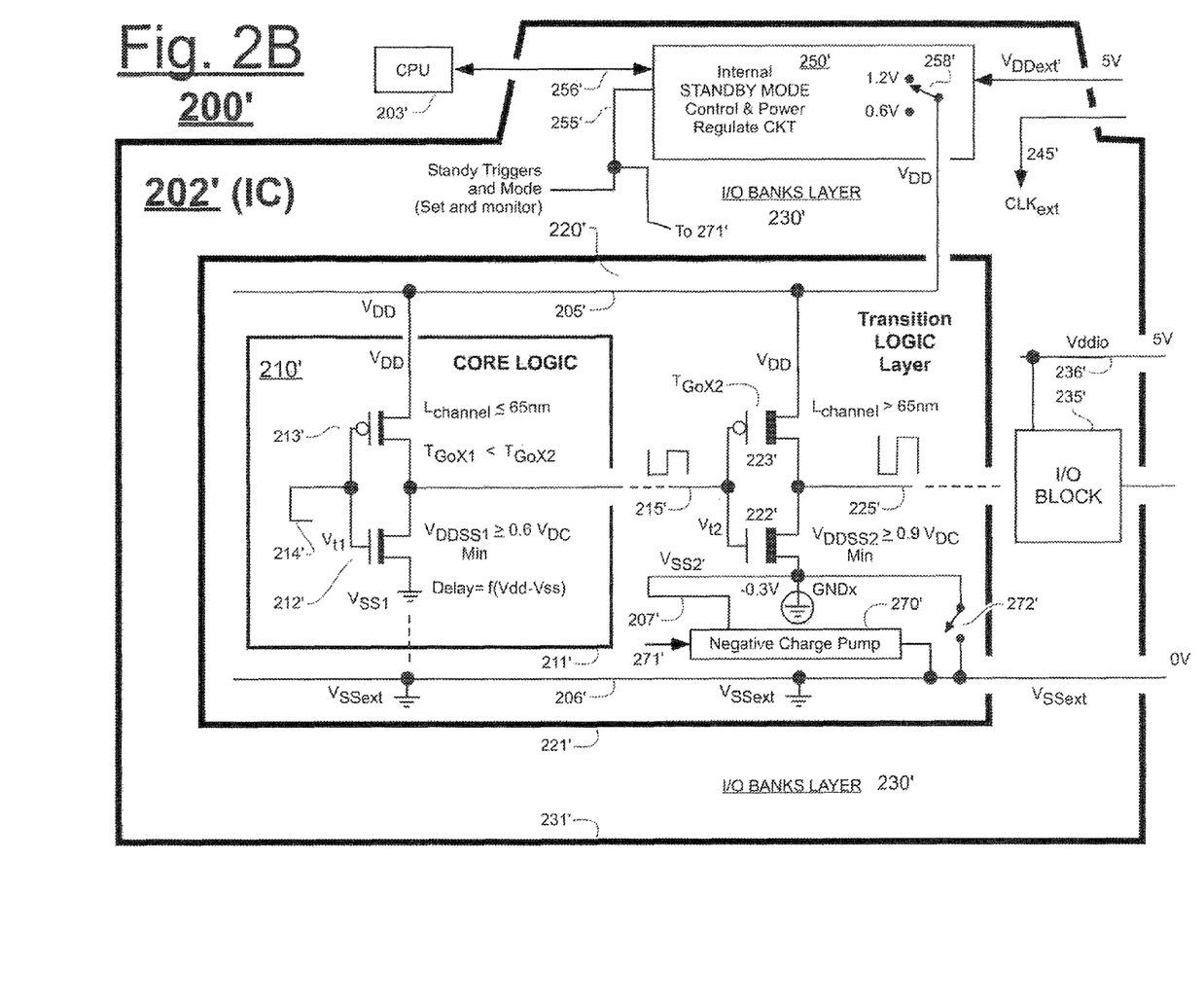
FIG. 2B is a block diagram of a third synchronous digital system that includes one or more monolithic integrated circuits (IC's) that are switchable into a low power consumption standby mode by at least reducing the applied power supply voltage for the core logic section if not also substantially reducing the frequency of an IC driving clock signal, wherein each IC has its own internal standby mode control circuit and internal power regulating circuitry.

Referring to FIG. 2A, and in accordance with one aspect of the present disclosure of invention, a regulated negative charge pump 270 is interposed between a system normal ground bus 206 and a special ground bus (GNDx) 207, where the special ground bus (GNDx) 207 is provided within the transition logic layer 220 for sinking current from the circuitry within the transition logic section 220. In FIG. 2A, like reference symbols and numbers in the "200" century series are used for elements of FIG. 2A which correspond to, but are not necessarily all the same as the elements represented by similar symbols and reference numbers of the "100" century series in FIG. 1. As such, an introductory description of most elements found in FIG. 2A is omitted here and focus is brought to bear on the key differences. It is to be noted that, because the special ground bus (GNDx) 207 needs to be provided only within the transition logic section 220, the circuit structures and physical layouts of the other sections (e.g., 210 and 230) in the IC 202 need not be greatly different from those of IC 102 of FIG. 1. Accordingly, if the design of IC 102 (FIG. 1) is already taped out and proven to work, conversion to the more power-conserving design of IC 202 (FIG. 2A) may be carried out without having to substantially rework the design of the entire IC.

In FIG. 2A, the regulated negative charge pump 270 of system 200 is activated by a control signal provided on line 271, where the latter may be originated from the SM control circuit 250 and may be transmitted to line 271 by way of control link 255. When the SM control circuit 250 decides (independently or under control of a CPU that drives line 256 and thereby controls circuit 250) to place the illustrated IC 202 into low power standby mode (LPSM), it turns on the negative charge pump 270 by activating line 271. The activation of line 271 also automatically opens up a previously closed switch 272, where the switch over occurs preferably after pump 270 begins powering up. (When switch 272 is closed, the special ground bus (GNDx) 207 is connected to the normal ground line 206.) In the illustrated embodiment, once it is activated, the negative charge pump 270 causes a negative voltage of about −0.3V to be present on the special ground bus (GNDx) 207, and this negatively driven bus 207 serves as the current-sinking ground plane used by the circuitry of transition logic section 220. At about the same time that the special ground bus (GNDx) 207 is driven negative, the SM control circuit 250 actuates a power supply selection switch 258 (shown in the upper right corner of FIG. 2A) so as to thereby cause the reduced +0.6V level rather than the normal +1.2V level to be delivered into IC 202 by way of the $V_{DDext}$ bus 205. The $V_{DDext}$ bus 205 connects to the $V_{DD1}$ supply bus of the core logic section 210 and to the $V_{DD2}$ supply bus of the transition logic section 220. As a result of the combination of the special ground bus (GNDx) 207 dropping down to the −0.3V level and the $V_{DDext}$ bus 205 being reduced to the +0.6V level, an operational voltage drop of $V_{DDSS2}$ equal to about +0.9V develops in the transition logic section 220, where the +0.9V magnitude is equal to or greater than a predetermined $V_{DDSS2MIN}$ potential that is minimally acceptable for deterministic operation of the transition logic section 220 at a predetermined minimum clock rate ($CLK_{min}$). At the same time the smaller and also operability enabling, rail-to-rail voltage drop, $V_{DDSS1}$ of about 0.6V develops in the core logic section 210, where the +0.6V magnitude is equal to or greater than a predetermined $V_{DDSS1MIN}$ potential that is minimally acceptable for deterministic operation of the core logic section 210 at a predetermined minimum clock rate ($CLK_{min}$). At the same time or afterwards, valid binary bit levels may appear on line 215 where the level-wise validity is true for both the core logic section 210 and the transition logic layer 220.

It is to be understood that during such instantiation of the low power standby mode (LPSM) in IC 202, the externally provided clock signal, $CLK_{ext}$ (245) will be typically switched to a substantially lower-than normal operating frequency (e.g., 5 MHz as opposed to a normal mode 50 MHz). Such switching of $CLK_{ext}$ (245) to the lower rate may be commanded by the SM control circuit 250 by way of clock control line 254; or alternatively an external CPU (not shown) may have access via line 256 to the clock control line 254 either directly or indirectly by way of SM control circuit 250 (where such access options are represented by the dashed line through block 250 connecting 256 to 254). Therefore and in such a case, power consumption by the core logic section 210 is dramatically reduced not only because its clock rate is reduced but also because the core section is being operated at a rail-to-rail voltage drop, $V_{DDSS1}$ equal to about +0.6V rather than the normal mode rail-to-rail voltage drop, $V_{DDSS1}$ of about +1.2V. More specifically, one form of maximum power draw during CMOS state switching can be modeled as being approximately equal to $(V_{DDSS1})^2/R_{meta}$ per CMOS stage where $R_{meta}$ refers to the combined resistances of the NMOS and PMOS transistors 212/213 when each is neither fully turned on or fully turned off, but is instead in an intermediate or meta state. Since $V_{DDSS1}$ has been cut in half (from +1.2V down to +0.6V), this type of meta-state power draw is reduced by as much as 75%. That is a significant amount of power saving. Additionally, because gate capacitances of NMOS transistors (e.g., 212) that are being turned-on are now being charged to only a maximum voltage of +0.6V rather than +1.2V, current draw over time for such state-changing charging of gate capacitances and the like (e.g., parasitic line capacitances) is reduced and energy consumption for this aspect of state change within transition logic layer 220 is reduced ($P=I^2*R_{line}$, where I is current or charge moved per unit time (dQ/dt) and $R_{line}$ is line resistance of the charge conveying interconnect).

Although FIG. 2A depicts the core logic section 210 generically, in one embodiment, core logic section 210 contains FPGA logic blocks whose logic operations are programmably reconfigurable in response to configuration data loaded into lookup tables (LUTs) and/or other configuration memory areas associated with the FPGA logic blocks and included in the IC 202. In one embodiment, the other configuration memory areas that are integrally formed within the IC 202 may utilize voltages that are different from those of the I/O blocks (e.g., 235) of the FPGA. It is to be understood that in such a case, appropriate transition logic circuitry may be provided (in section 220) for transitioning from the core voltages to the voltages used by the other configuration memory areas (e.g., nonvolatile memory technology). More specifically, the FPGA core logic section may include SRAM memory modules for storing configuration and/or other data loaded in from the other configuration memory areas (e.g., nonvolatile memory) and the transition logic layer 220 may, in that case, include appropriate transition logic circuitry for interfacing with the other configuration memory areas. Moreover, in cases where interaction with the other configuration memory areas is called for while the core logic section 210 is in low power standby mode (LPSM), the transition logic circuitry for interfacing with the other configuration memory areas may have its own, application specific special ground bus (like GNDx 207) but driven to an appropriate other negative voltage.

As mentioned above, the logic levels (signaling levels) used on the between-sections interconnect line 215 of FIG. 2A are level-wise valid for both the core logic section 210 and the transition logic layer 220. More specifically, although a logic "1" output signal (e.g., output on 215) of the core logic section 210 stage is only about 0.6V above normal ground (206), because of the negative charge pump 270, this translates into +0.9V above the special ground (GNDx 207) in the transition logic layer 220. Thus the interlayer signal 215 (when high) automatically represents a logic "1" both in the core logic section 210 and in the transition logic layer 220.

For the case of a logic "0" being output on line 215 from the core logic section 210 and to the transition logic layer 220, it should be recalled that transistors (e.g., 222, 223) in the transition logic layer 220 are designed to have a relatively larger threshold voltage ($V_{t2}$>$V_{t1}$) than that of the core logic section 210. More specifically, $V_{t2}$ is set to be substantially greater than 0.3V as measured relative to the special ground bus (GNDx) 207. Thus a 0V signal level output from the core logic section 210 translates into a gate-versus-source magnitude that is well-below threshold level $V_{t2}$ in so far as the receiving transition logic layer 220 is concerned. In other words, it is received as a deterministic and noise tolerating binary "0" indicating signal over line 215. Therefore deterministic circuit operation is assured for each of the core logic section 210 and transition logic layer 220 when in low power standby mode (LPSM) and a binary signal is being transmitted over an interconnect line such as 215 from the core to the transition logic layer 220.

When a binary signal is being transmitted the other way around and over an interconnect line such as 215 (but not necessarily 215 itself), namely, from the transition logic layer 220 to the core logic section 210; a +0.6V signal output from the transition logic layer 220 is identical to the +0.6V signal level expected by the core logic section 210 for representing a logic "1". If the core logic section 210 cannot tolerate a −0.3V signal being applied thereto (e.g., onto CMOS input line 214 for example) for thereby representing a logic "0", then appropriate level shifting can be easily accomplished with a voltage dropping resistor network or a voltage reducing capacitor network that causes the −0.3V signal to come out as a close 0V signal instead. A diode-connected transistor (not shown) can be used to selectively bypass the voltage dropping resistor network when a positive voltage representing logic "1" is being sent to core terminal 214. Therefore deterministic circuit operation is assured for each of the core logic section 210 and transition logic layer 220 when in low power standby mode (LPSM) and a binary signal is being transmitted over an interconnect line such as 214 from the transition logic layer 220 to the core logic section 210.

So to summarize briefly that which is shown in FIG. 2A, the core logic section 210 is structured to operate under two different digital signaling schemes, namely, a first digital signaling scheme that uses normal mode (NM) signaling levels (e.g., about +1.2V for representing a logic high ("1") and about 0V for representing a logic low ("0")) and a second digital signaling scheme that uses standby mode signaling levels (e.g., about +0.6V for representing a logic high ("1") and about 0V for representing a logic low ("0")). A different digital signaling scheme is used on input line 225 of the active I/O block 235 (e.g., +$V_{dd2}$ for representing a logic high ("1") and about 0V for representing a logic low ("0")). The transition logic section 220 is operatively coupled between the core logic section 210 and the input line 225 of the active I/O block 235 and provides appropriate transitioning as between the digital signaling schemes (first and second) used by the core logic section 210 and the different digital signaling scheme is used on input line 225. The transition logic section 220 uses a special ground bus (GNDx) 207 that is connected to normal ground during the normal operating mode of the core logic section 210 and that is connected to a negative power supply (270) during the low power standby mode (LPSM) of the core logic section 210.

Referring to FIG. 2B, a different embodiment 200' is shown here. In FIG. 2B, like reference symbols and numbers also in the "200" century series but having primes (apostrophes) at their respective ends are used for elements of FIG. 2B which correspond to, but are not necessarily all the same as the elements represented by similar, but not primed (not apostrophized) symbols and reference numbers in FIG. 2A. As such, an introductory description of most elements found in FIG. 2B is omitted here and focus is brought to bear on the key differences.

In FIG. 2B, an SM control circuit block 250' is integrally incorporated into IC 202' rather than being an external circuit. Additionally, the on-chip, SM control circuit block 250' includes a power supply voltage regulating and controlling subsection 258' that selectively switches a voltage $V_{DD}$ output on common power rail line 205' to either a normal operating level (e.g., +1.2V) or a standby mode level (e.g., +0.6V). The on-chip, power and standby mode control circuit block 250' receives an external source voltage, $V_{DDext}'$ (e.g., +5.0V) from an external source (not shown) and in response, generates various desired, on-chip supply voltages including the normal $V_{DD}$ operating level (e.g., +1.2V) and the standby mode level (e.g., +0.6V) for output on the chip-internal VDD line 205'.

In accordance with one embodiment mentioned for the case of FIG. 2A, in FIG. 2B an external CPU 203' or other data processing device (not shown) provides mode control signals along command line 256' (which can be a serial signal transmission line) and the on-chip, power and standby mode control circuit block 250' responds to a received command to go into standby mode by switching the voltage output on the chip-internal VDD line 205' from the predetermined normal operating level (e.g., +1.2V) to a predetermined standby mode level (e.g., +0.6V). Additionally, the SM control circuit block 250' responds to the received standby command by outputting a signal on chip-internal control line 271' that causes switch 272' to open and causes the 270' to become active and to drive the special ground bus (GNDx) 207' to a predetermined negative voltage (e.g., −0.3V). In the illustrated embodiment 200', it is left to the external CPU and/or other data processing device (not shown) that drives line 256' to switch the external clock signal ($CLK_{ext}$) of line 245' from the normal switching rate (e.g., 50 MHz) to the standby mode switching rate (e.g., 5 MHz) when a switch into standby mode is commanded. Unlike the case of FIG. 2a, since line 255' is internal to the chip 202' and already operating at a chip-internal signaling level (e.g., VDD to GND which levels are respectively provided on lines 205' and 206'), there is no need to pass the signals of line 255' through the I/O interface section 230' and/or the transition logic section 220' before they are applied to standby mode activating line 271' of the negative charge pump 270'.

Figure 3:
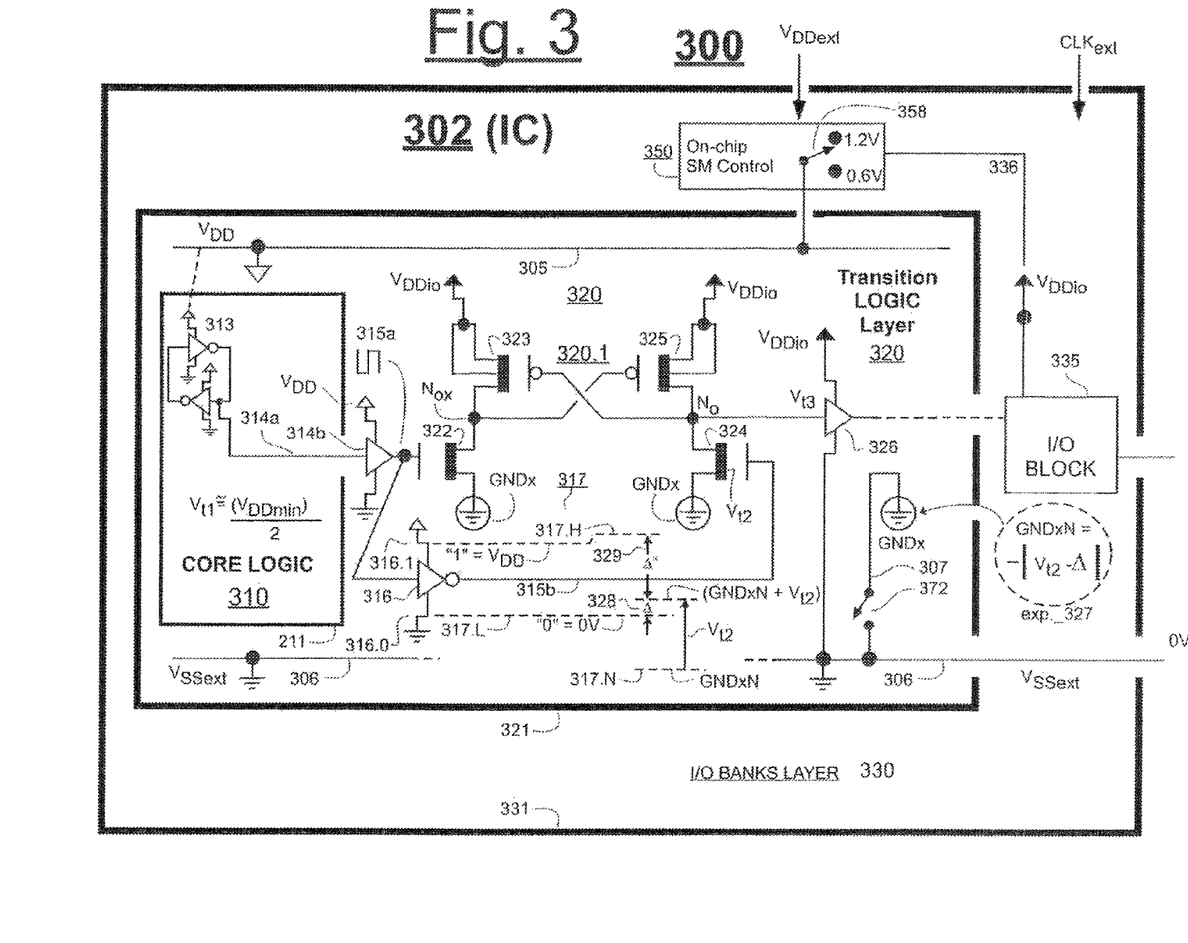
FIG. 3 is a schematic diagram of a fourth synchronous digital system that is switchable into a low power consumption standby mode.

Referring to FIG. 3, and in accordance with one embodiment 300, the transition logic layer 320 is structured to include a bistable level shifting module 320.1 that comprises enlarged CMOS transistors 322, 323, 324 and 325. It is to be understood that in FIG. 3, Like reference symbols and numbers in the "300" century series are used for elements of FIG. 3 which correspond to, but are not necessarily all the same as the elements represented by similar symbols and reference numbers of the primed "200" century series of FIG. 2B. As such, an introductory description of most elements found in FIG. 3 is omitted here (some elements are not fully shown) and focus is brought to bear on the key differences. As seen in FIG. 3, devices 322 and 324 are NMOS transistors each having a threshold voltage denoted as $V_{t2}$. Devices 323 and 325 are PMOS transistors having their respective source terminals coupled to receive a predefined I/O pull-up voltage, $+V_{DDio}$ and their drains respectively coupled to a complementary or inverted output node ($N_{ox}$) and a noninverted output node ($N_o$) of the exemplary level shifting module 320.1. The predefined I/O pull-up voltage, $+V_{DDio}$ is one also used by a corresponding I/O block 325 in layer 330 and by buffer amplifier 326.

Additionally in the exemplary level shifting module 320.1, the drain terminals of enlarged NMOS transistors 322 and 324 are also respectively coupled to the complementary output node ($N_{ox}$) and the noninverted output node ($N_o$). On the other hand, the source terminals of enlarged NMOS transistors 322 and 324 are coupled to the special ground bus 307 (GNDx). The charge pump (not shown, see e.g., 270 of FIG. 2A) which is used to drive the special ground bus (GNDx) in embodiment 300 after switch 372 is opened, is operated to urge the GNDx$_N$ negative voltage value equal to the expression shown in the dashed area denoted as exp.__327. More specifically, $$GNDx_N = \text{negative ABS}(V_{t2} - \Delta) \quad \text{Eq. 1}$$

where in equation Eq. 1, GNDx$_N$ equals the negative level to which the special ground bus 307 (GNDx) is driven during standby mode, ABS is the absolute value function, $V_{t2}$ is the threshold voltage of the enlarged NMOS transistors 322 and 324 (the gate-to-source voltage at which those transistors begin to effectively switch on) and delta ($\Delta$) is a specified positive margin of noise tolerance value above ground which the sum GNDx$_N$ plus $V_{t2}$ rises to. In the above example of FIG. 2B, it was assumed that $V_{t2}$ is about 0.6V and delta is about 0.3V, whereby those assumptions led to the exemplary case in FIG. 2B where during standby mode GNDx$_N$=−0.3V.

The delta value ($\Delta$) in the above equation Eq. 1 can be re-expressed as satisfying the following second equation Eq. 2:

$$\Delta = V_{t2} - \text{ABS}(GNDx_N) \quad \text{Eq. 2}$$

In other words, the value at which a gate driving voltage on line 315b is $V_{t2}$ greater than the GNDx$_N$ level corresponds to a level that is delta ($\Delta$) above the ground level (316.0) of the core logic section 310.

In FIG. 3, this relationship is explained with aid of a set of dashed level lines 317 which levels are drawn to help better illustrate the situation. The lowest of these dashed level lines, 317.N graphically represents the magnitude of the negative standby mode GNDx$_N$ voltage. The next highest of these dashed level lines, 317.L graphically represents the magnitude of the ground voltage level (e.g., 0V) of the core logic sections which represents a logic low ("0") in the context of the core logic section 310. This 317.L line is drawn to extend from the normal ground node 316.0 of buffer 316 and that line is further labeled to indicate that a logic low ("0") is to be represented on buffer output line 315b by the presence of a 317.L voltage thereon. A third of the dashed level lines, 317.H graphically represents the magnitude of the shared voltage level, $V_{DD}$ that represents a logic high ("1") not only in the context of the core logic section 310 but also in the context of transistors 322 and 324 of the transition logic section 320. This 317.H line is drawn to extend from the +$V_{DD}$ node (316.1) of buffer 316 and it is further labeled to indicate that a logic high ("1") is represented by the presence of a positive voltage (equal to +$V_{DD}$) being present on buffer output line 315b.

Between the 317.H and the 317.L dashed level lines, there is drawn yet another dashed level line showing graphically where the value, GNDx$_N$+$V_{t2}$ graph-wise lines up between the 317.H and 317.L levels. Since in equation Eq. 1, GNDx$_N$ is basically equal to −$V_{t2}$ plus $\Delta$, the value, GNDx$_N$+$V_{t2}$ is elevated by a equal to distance $\Delta$ above the "0"=0V dashed level line (317.L). The latter delta value ($\Delta$) should be roughly midway between the 317.H and 317.L levels.

Since the gate to source voltage, $V_{GS324}$ of transistor 324 is equal to $V_{315b}$ minus GNDx (where $V_{315b}$ represents the voltage on buffer output line 315b), the intermediate level, (GNDx$_N$+$V_{t2}$) is the level at which the gate voltage of transistor 324 crosses threshold. What this implies is that application of the "0"=0V level to the gate terminal of NMOS transistor 324 will keep the gate-to-source voltage ($V_{GS324}$) of this transistor below threshold (by a margin equal to delta) and thus NMOS transistor 324 will assuredly be kept turned off when the normal ground voltage (316.0) is applied on line 315b and the special ground bus voltage (GNDx=exp.327) is then applied on special ground line 307 during low power standby mode (LPSM).

Analysis of what happens during standby mode when buffer 316 outputs a logic "1"=+$V_{DD}$ signal to the gate of NMOS transistor 324 over line 315b can proceed in similar fashion. The +$V_{DD}$ level is a predetermined second delta ($\Delta''$) above the GNDx$_N$+$V_{t2}$ level. Thus even during low power standby mode (LPSM), the NMOS transistor 324 will assuredly be turned on when the +$V_{DD}$ level (316.1) is applied on line 315b and the special ground bus voltage (GNDx$_N$=exp.327) is applied on line 307 during such standby mode.

As a further analysis, it is considered next what happens under this condition (buffer 316 outputting a "1") if the +$V_{DD}$ level was suddenly raised (by operation of switch means 358 from the standby level (e.g., +0.6V) to the normal mode level (e.g., +1.2V) while the special, negative ground bus voltage (GNDx$_N$=exp.327) remains on bus 307. That would simply mean that the second delta ($\Delta''$) above the GNDx+$V_{t2}$ level grows even larger and the turned on state of NMOS transistor 324 is continued and is even more assured. In one embodiment, that is what is automatically done when responding to a command to switch from low power standby mode (LPSM) to normal mode (NM). The core clock is dropped from its low frequency rate to a temporary zero rate (no clock). The special ground bus 307 is kept at the special, negative ground bus voltage level (GNDx$_N$=exp.327) and then switch means 358 is actuated first to thereby raise the +$V_{DD}$ level from the standby level (e.g., +0.6V) to the normal mode level (e.g., +1.2V). Thereafter, switch 372 is closed and then the charge pump (not shown) is stopped so as to thereby raise the special ground bus 307 from the special ground bus voltage (GNDx$_N$=exp.327) to the higher, normal ground level. Thereafter, the core clock has its frequency increased (to full speed or optionally to an intermediate power consuming speed).

In one embodiment, automated switching from normal mode (NM) to low power standby mode (LPSM) in response to a received command to switch into the LPSM follows a time reversed; almost mirror symmetrical process of the above. First, the core clock has its frequency temporarily decreased to zero (no clock) and then has its rate raised to a lower than normal mode rate (e.g., to the minimum clock speed or optionally to an intermediate power consuming speed). Next, the charge pump is started up for generating the special ground bus voltage (GNDx=exp.327) and thereafter switch 372 is opened. Finally, switch means 358 is actuated to thereby drop the $+V_{DD}$ level from its normal mode value (e.g., +1.2V) to its low power standby mode level (e.g., +0.6V).

Referring next to operation of the illustrated circuitry from a stability point of view, in one embodiment, the core logic section 310 includes a first bistable digital circuit such as the simple flip flop illustrated at 313 where the latter is powered by the difference between the normal ground level (316.0) and the $+V_{DD}$ level (316.1) while the transition logic section 320 includes a second bistable digital circuit such as the illustrated simple flip flop circuit 320.1 where the latter is powered by the difference between the special ground bus (GNDx) level and the $+V_{ddIO}$ level. The input threshold voltage $V_{t1}$ for each of the inverters (322 plus 323 and 324 plus 325 respectively) of simple flip flop 313 is set in one embodiment, to approximately the midpoint value between the minimum designed level for $V_{DD}$ and normal ground. In other words, $Vt1 \approx 0.5 * V_{DDmin}$. During switching from normal mode (NM) to low power standby mode (LPSM), the in-core flip flop 313 retains its current one of opposed bistable states and the transition section flip flop circuit 320.1 retains its matching and current one of opposed bistable states. During switching from the low power standby mode (LPSM) to the normal mode (NM), the same thing happens, both flip flops retain their respective states because no signal is presented to either to cause that flip flop to switch states. It should be recalled that during switching between normal mode (NM) and low power standby mode (LPSM), the core clock is temporarily shut off so that no synchronous data state changes take place during mode switchover. If more complex flip flop designs had been shown for FF circuits 313 and 320.1, then the latter (not shown) would each include a clock enable terminal (EN) and a clock input terminal where at least the clock enable terminal (EN) is driven low by the SM control circuit block 350 during switchover from the normal mode (NM) to the low power standby mode (LPSM) and also during the vise versa switch back to normal mode (NM).

In the illustrated and merely exemplary embodiment of IC 302 (of FIG. 3), one output node (314a) of flip flop 313 is connected to an input of buffer 314b. A noninverting output of buffer 314b connects to the input of inverting buffer 316. Both of buffers 314b and 316 are powered by the $+V_{DD}$ rail 305 and the normal ground rail 306 ($V_{ssEXT}$). If buffer 314b is outputting a logic high ("1") onto line 315a, then inverting buffer 316 is outputting a complementary logic low ("0") onto complementary output line 315b. The logic high ("1") on line 315a turns on the enlarged NMOS transistor 322 and this action then drives the cross coupled PMOS transistor 325 to also be turned on. As a result, a corresponding logic high ("1") is output on node $N_o$ to the input of next buffer 326. The logic high ("1") on node $N_o$ is at or close to the $+V_{ddIO}$ level. This logic high ("1") on node $N_o$ also works to turn off the cross coupled PMOS transistor 323. Those skilled in the art will appreciate from the foregoing that simple cross-coupled flip flops are shown for purpose of illustration and ease of understanding and that more sophisticated flip flop designs (e.g., J-K designs with clock enable (EN) functionality, etc. included) can of course be utilized under the same basic teachings.

It may be quickly understood from the immediately above disclosure that if first flip flop 313 had instead output a logic low ("0") onto line 314a, the second flip flop 320.1 would in conforming fashion, output a matching logic low ("0") onto node $N_o$. The next in line buffer 326 may be designed to have its own threshold voltage level, $V_{t3}$ that is tailored for operating with appropriate noise rejection for both the case where special ground bus (GNDx) 307 is set at the special ground bus voltage (GNDx=exp.327) and the case where special ground bus (GNDx) 307 is shorted (by closing of switch 372) to the normal ground 306. The output of next in line buffer 326 is thereafter operatively coupled to corresponding I/O block 335.

It may further be understood from the immediately above disclosure that buffers 314b and 316 are superfluous and are included simply as convenient reference points. Transition input line 315a may have instead been directly connected to one output node of flip flop 313 while its complementary transition input line 315b may have instead been directly connected to the complementary other output node of flip flop 313. Buffers 314b and 316 were included here merely to simplify the explanation and the understanding of the underlying principles of the illustrated circuitry of FIG. 3.

Figure 4A:
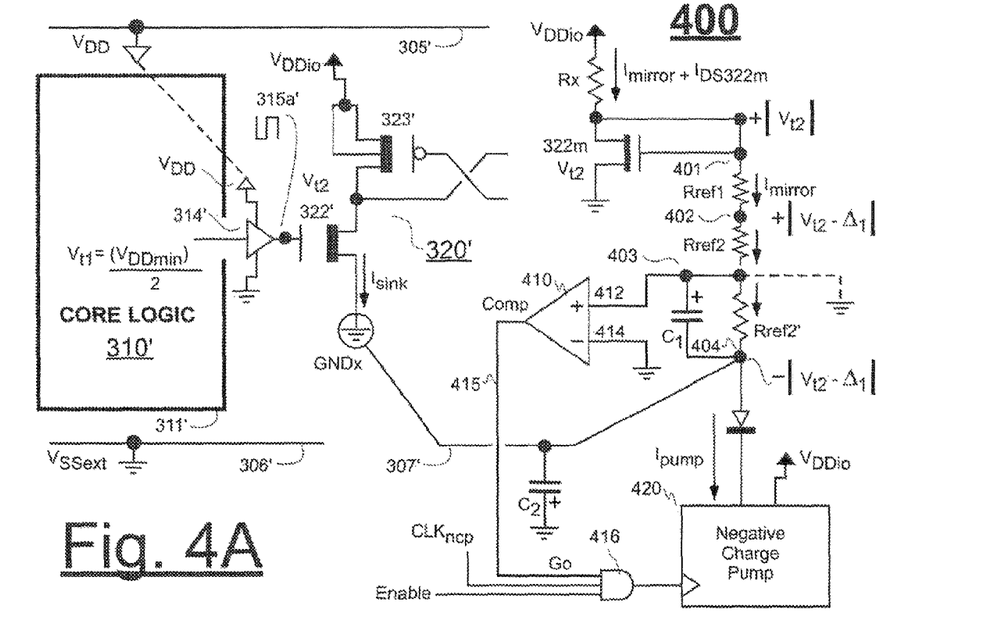
FIG. 4A is a schematic diagram of a voltage control subsystem usable in the systems of FIGS. 2A-2B and 3 for controlling the voltage of the special ground bus.

Referring next to FIG. 4A, another embodiment 400 in accordance with the present disclosure is shown that includes a charge pump design for attaining a desired special ground bus voltage (GNDx=exp.327) during LPSM. Some elements of FIG. 4A (e.g., core logic section 310') correspond to like numbered elements of FIG. 3. As such, an introductory description of the like elements found in FIG. 3 is omitted here.

NMOS transistor 322m at the right side of FIG. 4A is a scaled replica of in-circuit NMOS transistor 322' and behaves the same (due to being subject to the same fabrication process, same temperature, etc.) except that transistor 322m preferably has a smaller channel width so that a control current, $I_{DS322m}$ passed therethrough is of reduced magnitude as compared to what current would flow if transistor 322m (mirror transistor) where the same size as the in-circuit, operative NMOS transistor 322'. Replica NMOS transistor 322m has the same threshold voltage $V_{t2}$ ($>V_{t1}$) as do its represented NMOS logic transistors (e.g., 322') in the transition logic section 320'. Since replica NMOS transistor 322m is in a diode connected configuration (as shown) and since it has its source directly connected to normal ground, a voltage fairly close to its threshold voltage $V_{t2}$ forms at gate/drain node 401. More specifically, in FIG. 4A, the drain resistor Rx of NMOS transistor 322m is connected to the $+V_{ddIO}$ power rail (336'). A relatively small, and at threshold current, $I_{DS322m}$ plus $I_{mirror}$ is deemed to be flowing through resistor Rx due to the voltage difference, $V_{ddIO}-V_{t2}$ developed across that resistor Rx. The $I_{mirror}$ component alone flows below node 401 and through reference resistors Rref1 and Rref2 while the $I_{DS322m}$ component is consumed as current flowing from drain to source of, and through replica NMOS transistor 322m.

Reference resistors Rref1 and Rref2 are connected in series to form a precision voltage divider having dummy tap point 402. The bottom end of reference resistor Rref2 connects to lower node 403, where; as will be explained, node 403 is maintained essentially at the voltage level of the normal ground rail 306'. Consequently, the voltage at the dummy tap point 402 is intermediate between normal ground (0V) and the $+V_{t2}$ level developed at node 402. It is thus fair to define the voltage at the dummy tap point 402 as being equal to $V_{t2}$–delta$_1$ where the latter complete value is a positive one and is the voltage established by the precision voltage divider formed by resistors Rref1 and Rref2. More broadly speaking, resistors Rref1, Rref2 and third resistor Rref2' (where the primed version, Rref2' is essentially the same as non-primed resistor Rref2) may be viewed as defining a precision voltage divider network that has a plurality of voltage tap nodes (e.g., 401-404). A virtual ground level is established and maintained at one of those nodes (node 403) while a shared current, $I_{mirror}$ flows serially through all of them. A voltage level corresponding to the second threshold voltage (Vt2) is established at another one of the voltage divider nodes (at node 401). A voltage level between the virtual ground (node 403) and the second threshold voltage (Vt2) equivalent (node 401) is established at yet another of the divider nodes (at node 402). The mirror negative of that intermediate voltage equivalent (402) is through established at a fourth of the divider nodes node (at node 404) due to the symmetry of divider resistors Rref2 and Rref2'.

The virtual ground level (at node 403) is established and maintained by a feedback connected, voltage comparator 410. The comparator 410 has input terminals 412 (+) and 413 (−) of relatively high impedance and thus it is fair to say that $I_{mirror}$ further flows only through third reference resistor Rref2' and not into comparator input terminal 412(+). As mentioned, the third reference resistor, Rref2' is a twin of second reference resistor Rref2. Accordingly a same voltage drop equal to |$V_{t2}$|delta$_1$| develops across the third divider resistor Rref2' as it does across the across the second divider resistor Rref2, except that, because node 403 is at virtual ground level, node 404 is automatically driven to a negative voltage relative to ground, namely to: −|$V_{t2}$−Δ$_1$|. This remains essentially true as long as node 403 remains essentially at virtual ground (0V).

However, if the voltage at node 403 rises above the normal ground level (0V, to which input 414 is connected), the digital output 415 of comparator 410 switches to logic high ("1") and this condition (GO=True) causes pulses of a charge pump clock signal, $CLK_{ncp}$ to be applied through AND gate (assuming Enable is also high) and to thereby activate the negative charge pump 420 into pumping current, $I_{pump}$ out of the negative-side plates of respective capacitances C1 and C2, thus driving those plates more negative relative to true ground (terminal 414). That in turn, removes charge from capacitance C1 and thus reduces the voltage level at node 403 (and terminal 412 of the comparator). Once the voltage level at node 403 drops back down to equal normal ground (0V) again, the output 415 of comparator 410 switches to logic low ("0") and this condition (GO=False) stops the $CLK_{ncp}$ pulses from being applied through AND gate 416 for driving the negative charge pump 420.

Node 404 is stopped from drifting below (more negative than) the desired voltage level of −|$V_{t2}$−Δ$_1$| because positive charge is being persistently pumped into the special ground bus (GNDx) 307' as sunk current obtained from transition stage transistors like 322'. Such, to-be-sunk positive currents will continue to flow out of the source terminals of transistors like 322' as long as a slow switching clock (e.g., 5 MHz) is being used to toggle flip flops in the transition logic section 320'. (In a case where the slow clock is by chance turned off for a potentially long time, a current leakage path may be intentionally switched on within transition logic section 320' for the purpose of keeping node 404 from drifting too far down in the negative direction below the desired level of $GNDx_N$=−|$V_{t2}$−Δ$_1$|.)

Figure 4B:
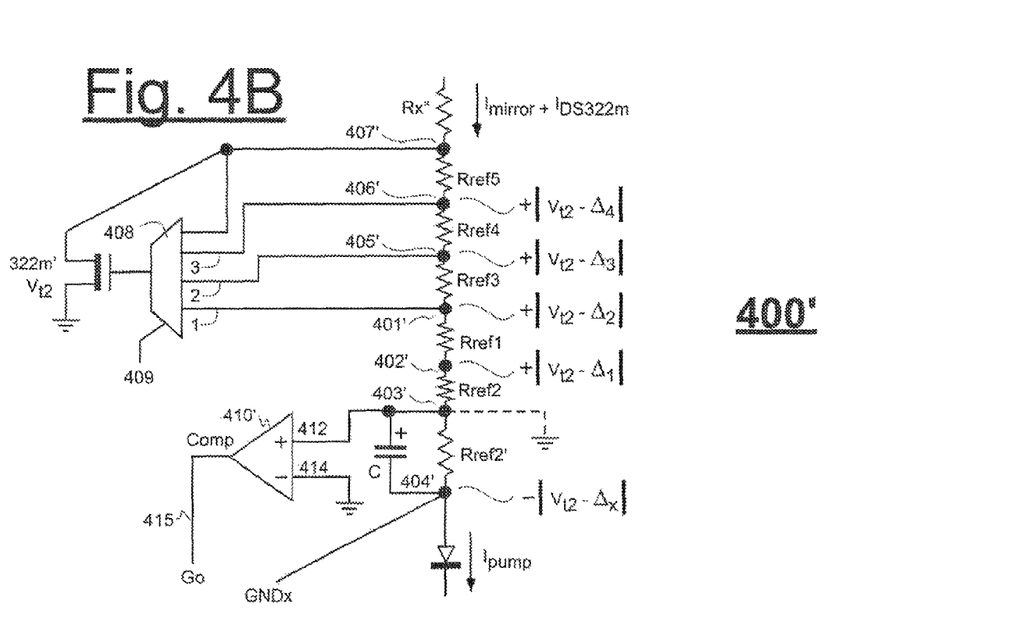
FIG. 4B is a schematic diagram showing of a programmable version of the voltage control subsystem of FIG. 4A.

FIG. 4B shows a digitally programmable variation 400' of the basic circuit disclosed in FIG. 4A. Because the circuits operate in substantially same ways, FIG. 4B merely shows the variation wherein the delta value, Δ$_x$ of node 404' is made digitally selectable. Similar (but primed) reference numbers are used in FIG. 4B and thus not all parts will be described again. NMOS transistor 322m' has its gate connected to the output of analog multiplexer 408. The control terminal 409 of the multiplexer 408 digitally determines which of analog input terminals 1, 2, 3, etc. will have its respective analog voltage coupled to the gate of the NMOS transistor 322m'. When analog input terminal number 1 is selected, the $V_{t2}$ threshold voltage appears at node 401' and resistor Rx' in series combination with resistors Rref3, Rref4 and Rref5 functions as the equivalent of Rx of FIG. 4A. Thus, when analog input terminal number 1 is selected, Δ$_x$ is caused to be equal to Δ$_1$.

If instead in FIG. 4B, analog input terminal number 2 is digitally selected, the $V_{t2}$ threshold voltage appears at node 405' and the precision resistive divider ladder to virtual ground (node 403') then includes Rref3 as well as Rref1 and Rref2. In that case, resistor Rx' in series combination with resistors Rref4 and Rref5 functions as the equivalent of Rx of FIG. 4A. Thus, when analog input terminal number 2 is selected, Δ$_x$ is caused to be equal to a different value, namely, Δ$_2$. In one embodiment, the values of Δ$_1$, Δ$_2$, and Δ$_3$ are respectively set as 50 mV (millivolts), 100 mV and 150 mV. Other and/or more values can of course be provided. Referring back to FIG. 3, and more specifically to the dashed graph lines 317 drawn as extending from buffer nodes 316.0 and 316.1, it may be seen that the delta gaps 328 and 329, that keep $GNDx_N$+$V_{t2}$ interposed between $V_{DD}$ and $V_{SSext}$, may be varied in magnitude by appropriate reprogramming of the variable delta circuit 400' of FIG. 4B. Reasons for using different delta gaps 328 and 329 may include a need for greater noise rejection or a need for lesser source to substrate leakage in the transistors of transition logic section 320' that have their corresponding source terminals pulled negative during the low power standby mode (LPSM) due to GNDx going negative. All is not utopian when the special ground bus (GNDx) is pulled negative. A possible mechanism for undesirable source to substrate leakage will now be discussed.

Figure 5A:
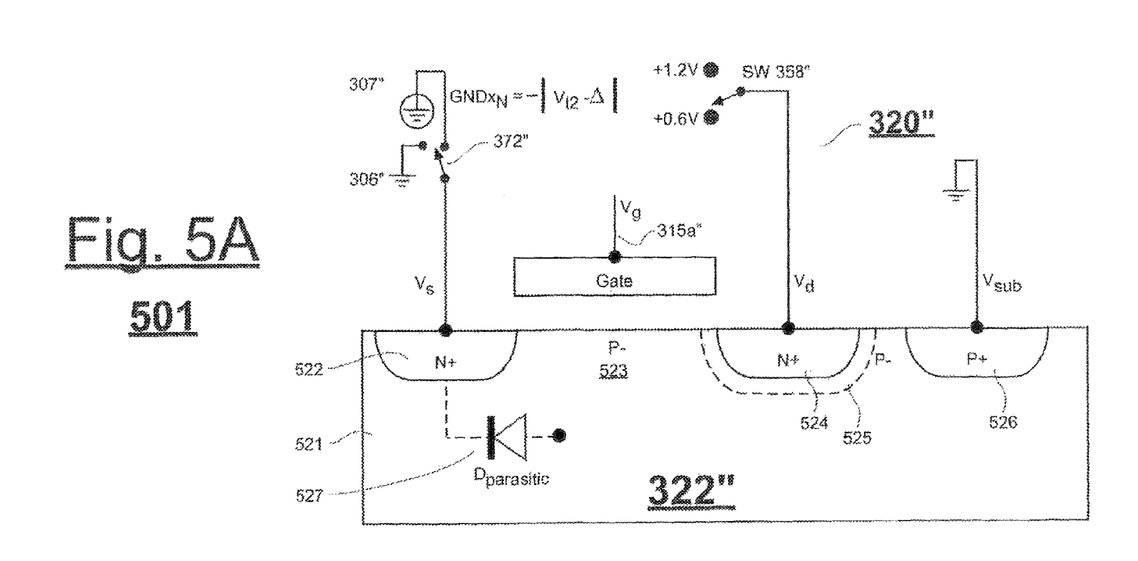
FIG. 5A is a schematic cross sectional view of a transition logic standby transistor when in low power standby mode.

Referring to FIG. 5A, shown is a schematic cross sectional view 501 of an NMOS transistor in the transition logic section 320" of an IC such as that of FIG. 3. More specifically, the examined NMOS transistor 322" corresponds to 322 of FIG. 3. The state of this exemplary NMOS transistor 322" is shown in combination with operating voltages provided for the low power standby mode (LPSM). More specifically, the exemplary NMOS transistor 322" is formed in a bulk silicon substrate 521 that is lightly doped to have a P− conductivity type bulk region. A heavily doped, first N+ region 522 is implanted in the substrate to define the source of the transistor 322". A spaced apart and also heavily doped, second N+ region 524 is implanted in the substrate to define the drain of the transistor. The P− region 523 disposed in between the source and drain defines a channel. The gate electrode is insulatively provided above the P− channel region 523. In the illustrated embodiment 322", a heavily doped, P+ region 526 is further provided and shown to be disposed to the right of the drain 524 to serve as a substrate contact area. The substrate contact area 526 is normally connected to ground.

Although the P+ substrate contact region 526 is separated from the N+ source region 522 by the P− bulk region 521, a parasitic and forward biased diode 527 nonetheless can form as between the N+ source region 522 and the grounded substrate contact area 526 during the low power standby mode (LPSM) due to the N+ source region 522 being held at a negative voltage (GNDx$_N$=exp.327<0V). Assuming that gate 315a" is at 0V and thus the transistor 322" is supposed to be turned off, a charge depletion region 525 correspondingly forms around the drain region 524 of the transistor 322" due at least to voltage gradient present between the grounded substrate contact area 526 and the positive voltage Vd applied to the drain region 524. Ideally, no leakage current should flow through the supposedly turned off transistor 322". However, that ideal is violated by the forward biased, parasitic diode 527 (D$_{parasitic}$).

Figure 5B:
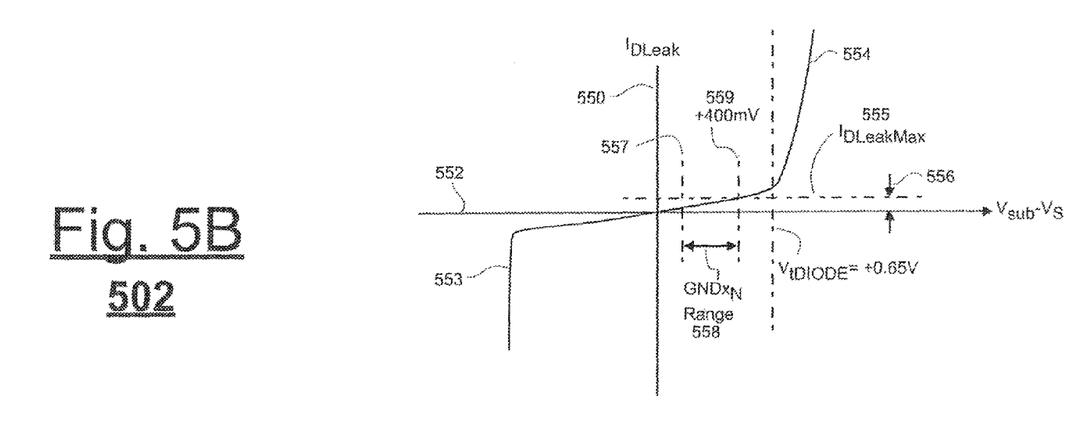
FIG. 5B is a graph illustrating how leakage current due to the parasitic forward biased diode of FIG. 5A can be limited.

FIG. 5B provides an exemplary, current versus voltage graph 502 for the parasitic diode 527 when subjected to a predetermined temperature. As those skilled in the art will appreciate from FIG. 5B, the left side portion 553 of the illustrated I$_{DLeak}$ curve (553-554) represents the diode's reverse biased behavior while the right side portion 554 represents the diode's forward biased behavior relative to applied anode to cathode voltage values (a.k.a. V$_{sub}$–V$_S$ in terms of voltages present in FIG. 5A).

In the illustrated example (FIG. 5B), the parasitic diode 527 is assumed to have a knee in its forward biased behavior curve portion 554 at around V$_{sub}$–V$_S$=+0.65V. Those skilled in the art will of course appreciate that diode current increases rapidly in magnitude above the voltage of the diode's forward biasing threshold or knee level (e.g., 0.65V). However, between the 0V origin point in the graph and the threshold level (V$_{tDIODE}$=+0.65V for example), the conducted current, I$_{DLeak}$ can be relatively small. A maximum allowed amount of predetermined-to-be-tolerable, leakage current is defined by line 555 (I$_{DLeakMax}$). The corresponding anode-to-cathode voltage across the parasitic diode 527 is assumed in this exemplary embodiment to be about +400 mV (illustrated as maximum diode voltage level 559). In the example, a predetermined-to-be-acceptable, minimum forward biasing level for the GNDx$_N$ range 558 is set at a predetermined level 557 above 0V. The different delta values of the variable delta embodiment 400' of FIG. 4B may be established within the illustrated GNDx range 558. Picking one over the other causes different magnitudes of tolerable leakage current to flow and also causes different magnitudes of the delta (328 in FIG. 3) to be established. The parasitic leakage current I$_{DLeak}$ that results from picking one GNDx$_N$ value in range 558 over another is thus bounded within a corresponding leakage range 556 which is defined as being between the maximum predetermined-to-be-tolerable, leakage current magnitude 555 (I$_{DLeakMax}$) and one above 0nA (zero nano Amperes).

Given a graph such as that of FIG. 5B, and with the goal of providing a relatively optimal low power standby mode (LPSM) being kept in mind, there is usually a subrange within the voltage biasing range 558 where the amount of IC power reduction obtained from lowering the V$_{DD}$ of the core logic section (see 305 and 310 of FIG. 3) is significantly greater than the amount of power lost (leaked) due to the forward biasing of the parasitic diodes (527) in the transition logic section 320" of the corresponding IC (e.g., 302). An empirical tradeoff model may be developed for determining what subrange within tolerable voltage range 558 (of FIG. 5B) is well suited for reducing IC power consumption during low power standby mode (LPSM) while still maintaining adequate noise rejection and behavioral determinism. It has been found through a computer simulation which accounts for the parasitic diode leakage current defined by plot 554, that a substantial positive reduction of power consumption by the core logic section 320" can be obtained even though some of that saved power consumption is lost back to the parasitic diode leakage current mechanism (554) when the size of the core logic section (e.g., 310) is relatively large (e.g., in terms of active core logic transistors like 212' and 213' of FIG. 2B) and the number of leaky NMOS transistors in the transition logic section 320" (e.g., transistor 322") is comparatively smaller. In other words, the power loss due to I$_{DLeak}$ in the GNDx$_N$ range 558 of FIG. 5B is offset, and then some, by the substantial reduction of power consumption achieved in the core logic section (e.g., 310) due to reduction of the core logic V$_{DD}$ voltage from say, 1.2V to 0.6V (for example) when a switch is made from normal mode (NM) to low power standby mode (LPSM).

Of course, other solutions to the parasitic leakage problem may be used; such as for example isolating the transition logic section 320 in its own substrate well, where that isolated well has its bulk biased to the voltage of the special ground bus (GNDx) 207/307 so that formation of the parasitic diodes (527) in the transition logic section 220/320 is avoided. However, such an alternate solution would call for substantial redesign of the integrated circuit (e.g., IC 202/302) whereas a much less substantial redesign is called for if the minor amount of power loss by the parasitic diodes (527 in FIG. 5A) is accepted in view of the greater gain in terms of power saving that is obtained from reducing the V$_{DD}$ drain voltage of the core logic section 210/310 to an operative value (e.g., 0.6V) that is substantially less than the normal operating value (e.g., 1.2V).

The present disclosure is to be taken as illustrative rather than as limiting the scope, nature, or spirit of the subject matter claimed below. Numerous modifications and variations will become apparent to those skilled in the art after studying the disclosure, including use of equivalent functional and/or structural substitutes for elements described herein, use of equivalent functional couplings for couplings described herein, and/or use of equivalent functional steps for steps described herein. Such insubstantial variations are to be considered within the scope of what is contemplated and taught here. Moreover, if plural examples are given for specific means, or steps, and extrapolation between and/or beyond such given examples is obvious in view of the present disclosure, then the disclosure is to be deemed as effectively disclosing and thus covering at least such extrapolations.

By way of one example of such possible variations, it is to be understood that use in the transition logic sections 320 (FIG. 3) of the illustrated four transistor flip flop circuit 320.1 is just an example and that other types of transition logic layer circuits could instead be used such as analog interface circuits that connect for example to an out-of-core memory section (e.g., a nonvolatile FPGA configuration memory). By way of another example of such variation, it is to be understood that the configuring of a reconfigurable device (e.g., an FPGA) in accordance with the disclosure can include use of an external CPU or computer to define which delta voltage (e.g., the Δ$_x$ of node 404' of FIG. 4B) is to be used under different ones of predetermined conditions (e.g., different temperatures, different noise environments, etc.) and that machine-implemented methods for such environment sensitive resettings of the special ground bus voltage (GNDx$_N$) are within the contemplation of the present disclosure. Accordingly, a computer-readable data storage medium or another form of a software product or machine-instructing means (including but not limited to, a hard disk, a compact disk, a flash memory stick, a downloading of manufactured instructing signals over a network and/or like physical software products) may be used for instructing an instructable machine to carry out such automatically responsive state changes to environmental conditions, where the responsive state changes can include selective activation of different forms of the low power standby mode (LPSM) at different delta values ($\Delta_x$) for different ICs within a system based on the temperatures and noise environments that each of those of ICs or the collective is determined to be exposed to.

After this disclosure is lawfully published, the owner of the present patent application has no objection to the reproduction by others of textual and graphic materials contained herein provided such reproduction is for the limited purpose of understanding the present disclosure of invention and of thereby promoting the useful arts and sciences. The owner does not however disclaim any other rights that may be lawfully associated with the disclosed materials, including but not limited to, copyrights in any computer program listings or art works or other works provided herein, and to trademark or trade dress rights that may be associated with coined terms or art works provided herein and to other otherwise-protectable subject matter included herein or otherwise derivable herefrom.

If any disclosures are incorporated herein by reference and such incorporated disclosures conflict in part or whole with the present disclosure, then to the extent of conflict, and/or broader disclosure, and/or broader definition of terms, the present disclosure controls. If such incorporated disclosures conflict in part or whole with one another, then to the extent of conflict, the later-dated disclosure controls.

Unless expressly stated otherwise herein, ordinary terms have their corresponding ordinary meanings within the respective contexts of their presentations, and ordinary terms of art have their corresponding regular meanings within the relevant technical arts and within the respective contexts of their presentations herein. Descriptions above regarding related technologies are not admissions that the technologies or possible relations between them were appreciated by artisans of ordinary skill in the areas of endeavor to which the present disclosure most closely pertains.

Given the above disclosure of general concepts and specific embodiments, the scope of protection sought is to be defined by the claims appended hereto. The issued claims are not to be taken as limiting Applicant's right to claim disclosed, but not yet literally claimed subject matter by way of one or more further applications including those filed pursuant to 35 U.S.C. §120 and/or 35 U.S.C. §251.

What is claimed is:

1. An integrated circuit comprising:
   a core logic section operable under a normal-mode power voltage during a normal operating mode of the integrated circuit and operable under a standby mode power voltage during a standby mode of the integrated circuit, the core logic section able to use first digital signaling levels when operating under the normal-mode power voltage and to use second digital signaling levels when operating under the standby mode power voltage;
   a first ground bus to which the normal-mode power voltage and standby mode power voltage are applied;
   a digital signal outputting section able to use third digital signaling levels for outputting digital data signals to circuitry outside the integrated circuit; and
   a transition logic section operable under the normal-mode power voltage during the normal operating mode and operable under the standby mode power voltage during the standby mode, the transition logic section operable to provide signal level shifting as between the first and second digital signaling levels used by the core logic section and the third signaling levels used by the digital signal outputting section the transition logic section including a second ground bus,
   wherein the second ground bus is operable to couple to the first ground bus during the normal operating mode and is operable to couple to a negative voltage supply during the standby mode.

2. The integrated circuit of claim 1, wherein the negative voltage supply is part of the integrated circuit.

3. The integrated circuit of claim 1, wherein the negative voltage supply includes a charge pump within the integrated circuit.

4. The integrated circuit of claim 1, wherein the digital signal outputting section is operable under an I/O power voltage different from the normal-mode power voltage and the standby mode power voltage.

5. The integrated circuit of claim 1 including a standby mode control circuit.

6. The integrated circuit of claim 1, wherein the core logic section includes FPGA logic blocks.

7. The integrated circuit of claim 1, wherein the core logic section is operable at a normal mode clocking frequency during the normal operating mode and is operable at a standby mode clocking frequency during the standby mode.

8. An integrated circuit comprising:
   a core logic section operable under a normal-mode power voltage during a normal operating mode of the integrated circuit and operable under a standby mode power voltage during a standby mode of the integrated circuit, the core logic section able to use first digital signaling levels when operating under the normal-mode power voltage and to use second digital signaling levels when operating under the standby mode power voltage;
   a first ground bus to which the normal-mode power voltage and standby mode power voltage are applied;
   a digital signal outputting section able to use third digital signaling levels for outputting digital data signals to circuitry outside the integrated circuit;
   a transition logic section operable to provide signal level shifting as between the first and second digital signaling levels used by the core logic section and the third signaling levels used by the digital signal outputting section, the transition logic section including a second ground bus,
   wherein the second ground bus is operable to couple to the first ground bus during the normal operating mode and is operable to couple to a negative voltage supply during the standby mode.

9. The integrated circuit of claim 8, wherein the core logic section includes the first bus, and the transition logic section is operable under the normal-mode power voltage during the normal operating mode and is operable under the standby mode power voltage during the standby mode.

10. The integrated circuit of claim 8, wherein the core logic section is operable at a normal mode clocking frequency during the normal operating mode and is operable at a standby mode clocking frequency during the standby mode.

11. A method for reducing power consumption in an integrated circuit comprising:
    providing a core logic section operable under a normal-mode power voltage during a normal operating mode of the integrated circuit and operable under a standby mode power voltage during a standby mode of the integrated circuit;
    providing a first ground bus to which the normal-mode power voltage and standby mode power voltage are applied;
    providing a transition logic section operable under the normal-mode power voltage during the normal operating mode and operable under the standby mode power voltage during the standby mode; and coupling the transition logic section to the first ground bus during the normal operating mode and to a negative voltage supply during the standby mode.

12. The method of claim 11 including providing a digital signal outputting section able to use third digital signaling levels for outputting digital data signals to circuitry outside the integrated circuit;

wherein:
- the core logic section is able to use first digital signaling levels when operating under the normal-mode power voltage and to use second digital signaling levels when operating under the standby mode power voltage; and
- the transition logic section is operable to provide signal level shifting as between the first and second digital signaling levels used by the core logic section and the third signaling levels used by the digital signal outputting section.

13. The method of claim 11, wherein the transition logic section couples to the negative voltage supply through a second ground bus during standby mode.

* * * * *